(12) United States Patent
Mineo (10) Patent No.: US 7,458,837 B2
(45) Date of Patent: Dec. 2, 2008

(54) CONNECTOR HOUSING BLOCK, INTERFACE MEMBER AND ELECTRONIC DEVICE TESTING APPARATUS

(75) Inventor: Hiroyuki Mineo, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/589,823

(22) Filed: Oct. 31, 2006

(65) Prior Publication Data

US 2007/0167083 A1    Jul. 19, 2007

Related U.S. Application Data

(63) Continuation of application No. PCT/JP2006/300338, filed on Jan. 13, 2006.

(51) Int. Cl.
*G01R 31/02* (2006.01)
(52) U.S. Cl. ........................ 439/248; 324/754
(58) Field of Classification Search .............. 439/247, 439/248; 324/754, 761, 765
See application file for complete search history.

(56) References Cited

U.S. PATENT DOCUMENTS

| | | | | |
|---|---|---|---|---|
| 4,528,500 A | * | 7/1985 | Lightbody et al. | 324/537 |
| 4,707,655 A | * | 11/1987 | Kruger | 324/756 |
| 4,795,977 A | * | 1/1989 | Frost et al. | 324/537 |
| 5,555,422 A | * | 9/1996 | Nakano | 324/754 |
| 5,656,942 A | * | 8/1997 | Watts et al. | 324/754 |
| 5,752,845 A | * | 5/1998 | Fu | 439/247 |
| 6,078,187 A | * | 6/2000 | Hanners et al. | 324/761 |
| 6,377,062 B1 | * | 4/2002 | Ramos et al. | 324/758 |
| 7,053,643 B2 | * | 5/2006 | Ruff et al. | 324/761 |
| 7,138,811 B1 | * | 11/2006 | Mahoney et al. | 324/754 |
| 2005/0083071 A1 | * | 4/2005 | Hartnett et al. | 324/754 |
| 2005/0140383 A1 | | 6/2005 | Inoue et al. | |

FOREIGN PATENT DOCUMENTS

| | | | | |
|---|---|---|---|---|
| EP | 1 542 028 A1 | 6/2005 | | |
| JP | 63-40334 | * | 2/1988 | 324/756 |
| JP | 63-281079 | 11/1988 | | |
| JP | 2003-503712 | 1/2003 | | |
| JP | 2004-085238 | 3/2004 | | |
| JP | 2004-108898 | 4/2004 | | |
| JP | 2005-083863 | 3/2005 | | |
| WO | WO 01/01247 A2 | 1/2001 | | |

* cited by examiner

*Primary Examiner*—Neil Abrams
(74) *Attorney, Agent, or Firm*—Posz Law Group, PLC (57) ABSTRACT

In a connector housing block 260 comprising an interface member 200 for electrically connecting a test head body 100 with sockets 320 in an electronic device testing apparatus, a connector housing 240 provided with a plurality of connector pins 242 in a non-floating state is attached to a block base 230 in a floating state via a coil spring 250. Due to the configuration, the number of parts of the connector housing 240 can be reduced, mounting density of the connector pins 242 can be improved, and a positional error of the connector housing 240 can be absorbed.

14 Claims, 9 Drawing Sheets

RELATED ART

CONNECTOR HOUSING BLOCK, INTERFACE MEMBER AND ELECTRONIC DEVICE TESTING APPARATUS

CROSS REFERENCE TO RELATED APPLICATIONS

This application is a continuation of PCT/JP2006/300338, filed on Jan. 13, 2006, the contents of which are incorporated herein by reference.

TECHNICAL FIELD

The present invention relates to a connector housing block used for an interface for electrically connecting a test head body with sockets in an electronic device testing apparatus, and an interface member and electronic device testing apparatus provided with the connector housing block.

BACKGOUND ART

Conventionally, as an electronic device testing apparatus for testing performance and function of IC device and other electronic device, those including a test head body incorporating a signal module for processing signals, a performance board provided with sockets for an electronic device to be detachably attached, and an interface member provided between the signal module of the test head and the performance board for connecting the two are known.

In an electronic device testing apparatus as above, a plurality of kinds of signal modules, each processes a test signal having a different frequency and power, etc. are used in some cases. In that case, connector pins provided to the interface member have to correspond to each test signal for use. Therefore, the interface member has to be provided with a plurality of kinds of connector pins. As to the connector pins, for example, a large number of co-axial type pins for an ultra high-frequency wave required to give desired transmission quality even at several tens of GHz may be necessary.

On the other hand, an arrangement and the number of IC leads, and a kind of signal to be required, etc. for electronic devices to be tested vary depending on kinds of the electronic devices to be tested. Accordingly, what kind of connector pins should be arranged where by how many on the interface member differs for each kind of the electronic devices to be tested. Therefore, in the electronic device testing apparatus as explained above, a prescribed kind and number of connector pins have to be arranged on prescribed positions on the interface member for each of different electronic devices to be tested, and the arranging task has been cumbersome.

To solve such a problem, it may be considered to hold by a plurality of block bases a plurality of different kinds of connector housings provided with a plurality of connector pins and, in accordance with different kinds of electronic devices to be tested, to suitably exchange the connector housings or the connector housing blocks, wherein the connector housings are held by the block bases. By this method, the connector pins can be exchanged collectively.

DISCLOSURE OF THE INVENTION

Connector pins provided to the interface member are connected to connector pins of the performance board and, when fitting the connectors of the interface member with the connectors of the performance board to attach the performance board to the interface member, positional error may arise between the both connectors. To absorb the positional error to surely connect the connector pins of the interface member to the connector pins of the performance board, each connector pin of the interface member was supported by a coil spring so as to be in a floating state, so that each connector pin was movable separately in the X-axis, Y-axis and Z-axis directions.

Figure 8:
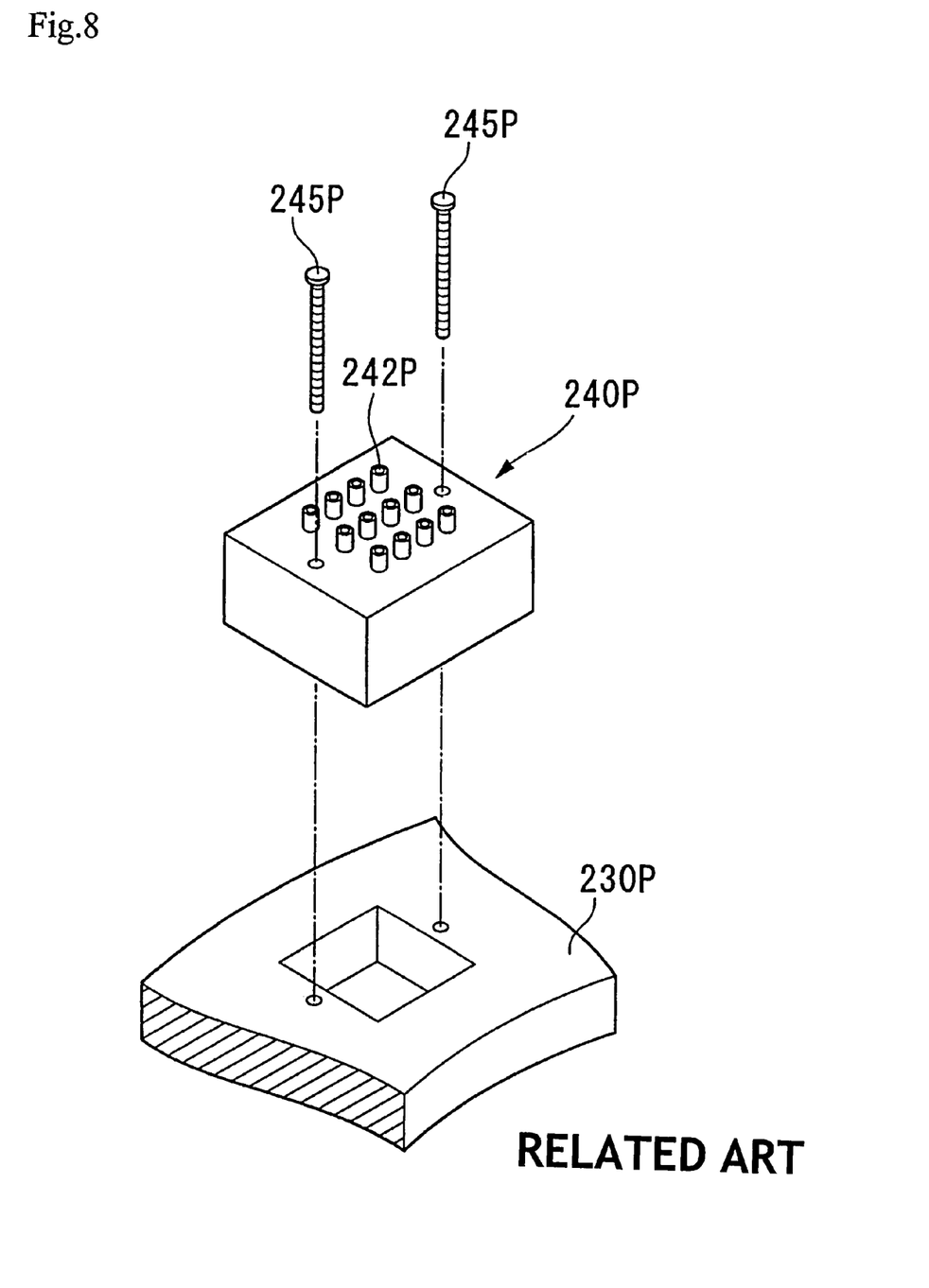
FIG. 8 is a perspective view of a connector housing in the related art.
Figure 9:
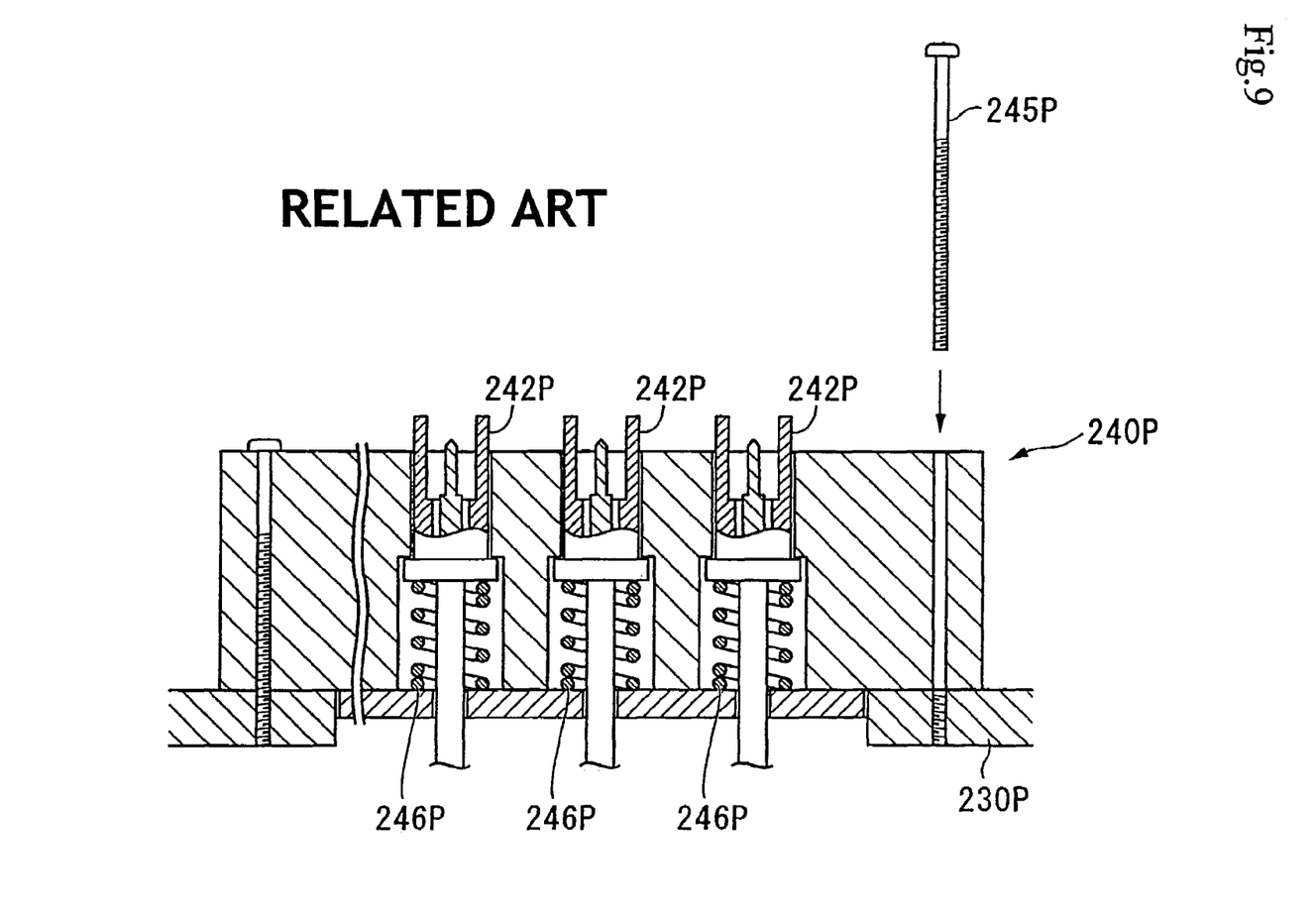
FIG. 9 is a sectional view of the connector housing in the related art.

FIG. 8 and FIG. 9 show an example of the configuration of supporting respective connector pins 242P by coil springs 246P in a connector housing 240P and fixing the connector housing 240P to a block base 230P by screws 245P.

However, when each of the connector pins 242P is made separately movable by the floating structure by the coil spring 246P, there are disadvantages that the number of parts increases and the production cost increases. Also, since the number of pins has been increasing in electronic devices in recent years, the number of connector pins 242P to be provided to the interface member also increases along therewith. However, when providing the coil springs 246P to the respective connector pins 242P, the connector pins 242P cannot be arranged close to each other and hard to be mounted at high density. Also, due to the limitation of the mounting density of the connector pins 242P, there is a disadvantage that the interface member becomes large.

The present invention was made in consideration of the above circumstances and has as an object thereof to provide a connector housing block, an interface member and an electronic device testing apparatus, wherein connector pins can be arranged at high density and a positional error of the connector housing can be absorbed with a simple configuration.

To attain the above object, first, the present invention provides a connector housing block used in an interface for electrically connecting a test head body and sockets in an electronic device testing apparatus, comprising a connector housing and a block base; wherein the connector housing is provided with a plurality of connector pins in a non-floating state; and the connector housing is attached to the block base in a floating state (invention 1).

According to the above invention (invention 1), even when a positional error arises between the connector housing and a connector to be fit with the connector housing, the connector housing in a floating state moves suitably to absorb the positional error, and the both are fit to each other in an aligned state. In a connector housing block as such, the respective connector pins do not have to be in a floating state by using springs, etc. as in the conventional case, so that the number of parts of the connector housing is reduced and the connector housing can be produced with a simple configuration. Furthermore, the spring and a space for providing them as in the conventional case become unnecessary for each connector, consequently, a plurality of pins can be arranged closely and mounted at high density.

In the above invention (invention 1), preferably, an elastic body is provided between the connector housing and the block base (invention 2).

In the above invention (invention 2), preferably, the elastic body is a coil spring (invention 3).

In the above invention (invention 1), preferably, the connector housing is provided with a guide portion capable of aligning the connector housing with a member to be connected to the connector housing (invention 4).

According to the above invention (invention 4), when fitting the connector housing with a connector to be fit in the connector housing, the both can be guided by guide portions, so that fitting of the both can be attained precisely.

In the above invention (invention 4), preferably, the guide portion is a guide pin or a guide hole capable of fitting with a guide hole or a guide pin formed on a member to be connected to the connector housing (invention 5).

In the above invention (invention 4), preferably, a member to be connected to the connector housing is a performance board (invention 6).

In the above invention (invention 1), the connector pin may have a coaxial structure for high-frequency wave (invention 7).

In the above invention (invention 1), preferably, the block base has an approximately arc shape when viewed from above (invention 8). By combining and arranging a plurality of connector housing blocks provided with such a block base circularly and arranging sockets at a position corresponding to the center, lengths of signal paths form respective connector pins of the connector housing block to the sockets can be approximately the same, so that preferable signal paths being hard to give adverse effects on tests can be formed.

Secondary, the present invention provides an interface member comprising the connector housing block (inventions 1 to 8) (invention 9).

In the above invention (invention 9), preferably, the connector housing block is arranged circularly (invention 10).

Thirdly, the present invention provides an electronic device testing apparatus comprising the interface member (invention 9) (invention 11).

Fourthly, the present invention provides a connector fitting device comprising a first substrate having sockets for an electronic device to be tested to be attached and a second substrate connected to a test head body to be electrically connected to the first substrate, wherein the first substrate is provided with a first connector having a plurality of connector pins; the first connector is provided with a first guide hole or a first guide pin for regulating fitting; the second substrate is provided with a second connector having a plurality of connector pins at a position corresponding to the first connector of the first substrate; and the second connector is provided with a second guide pin or a second guide hole for fitting with a first guide hole or a first guide pin of the first connector to align the both connectors, and is provided to the second substrate to be able to swing (invention 12).

In the above invention (invention 12), preferably, the first substrate is a performance board, and the second substrate is an interface member (invention 13).

Fifthly, the present invention provides an electronic device testing apparatus comprising the connector fitting device (invention 12) (invention 14).

EFFECT OF THE INVENTION

According to the present invention, it is possible to reduce the number of parts of the connector housing, and mounting density of the connector pins can be improved, that is, the connector pins can be arranged at high density. Also, by attaching the connector housing in a floating state, a positional error can be absorbed when fitting the connector housing.

EXPLANATION OF REFERENCES

1 . . . test head
10 . . . IC device (electronic device)
100 . . . test head body
200 . . . interface member
230 . . . block base
240 . . . connector housing
241 . . . housing body
242 . . . connector pin
243 . . . guide pin (guide portion)
250 . . . coil spring (elastic body)
260 . . . connector housing block
300 . . . performance board
340 . . . connector
341 . . . connector pin
342 . . . guide hole

BEST MODE FOR CARRYING OUT THE INVENTION

Below, an embodiment of the present invention will be explained based on the drawings.

Figure 1:
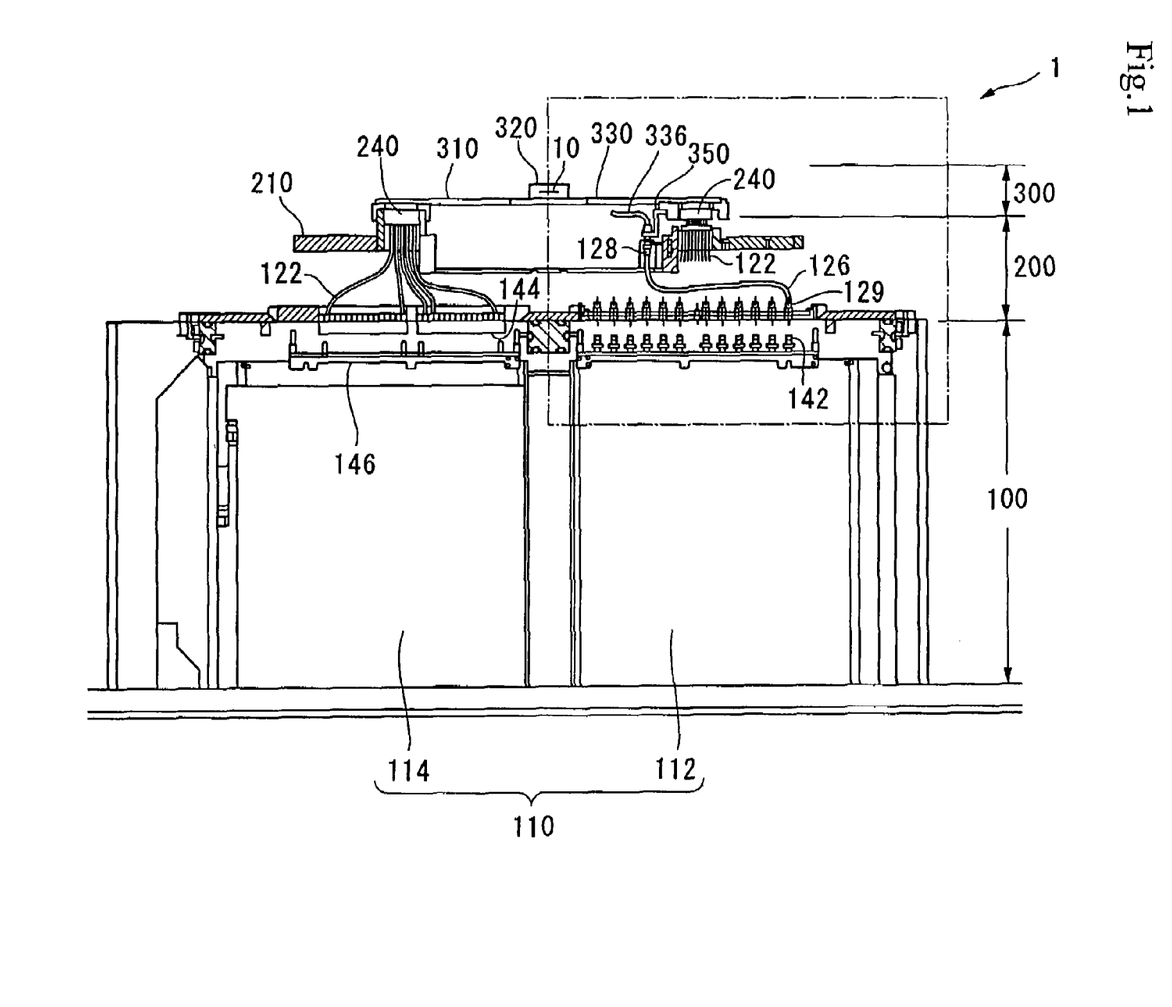
FIG. 1 is a sectional view of a test head in an electronic device testing apparatus according to an embodiment of the present invention.

An electronic device testing apparatus in the present embodiment comprises a test head 1 shown in FIG. 1 and a not shown handler and tester. The handler is for handling an IC device 10 (an example of an electronic device) and mounting on the test head 1, and the tester is for generating an electronic signal and sending/receiving the electronic signal to/from the test head 1.

The test head 1 comprises, as shown in FIG. 1, a test head body 100 for inputting/outputting a test signal, a performance board 300 for IC devices 10 to be detachably attached, and an interface member 200 for electrically connecting the test head body 100 with the performance board 300. Note that the performance board 300 is also called, for example, as a load board or a circuit board, and the interface member 200 is also called, for example, as a hi-fix, a test head chassis, a test fixture or top plate.

Figure 2:
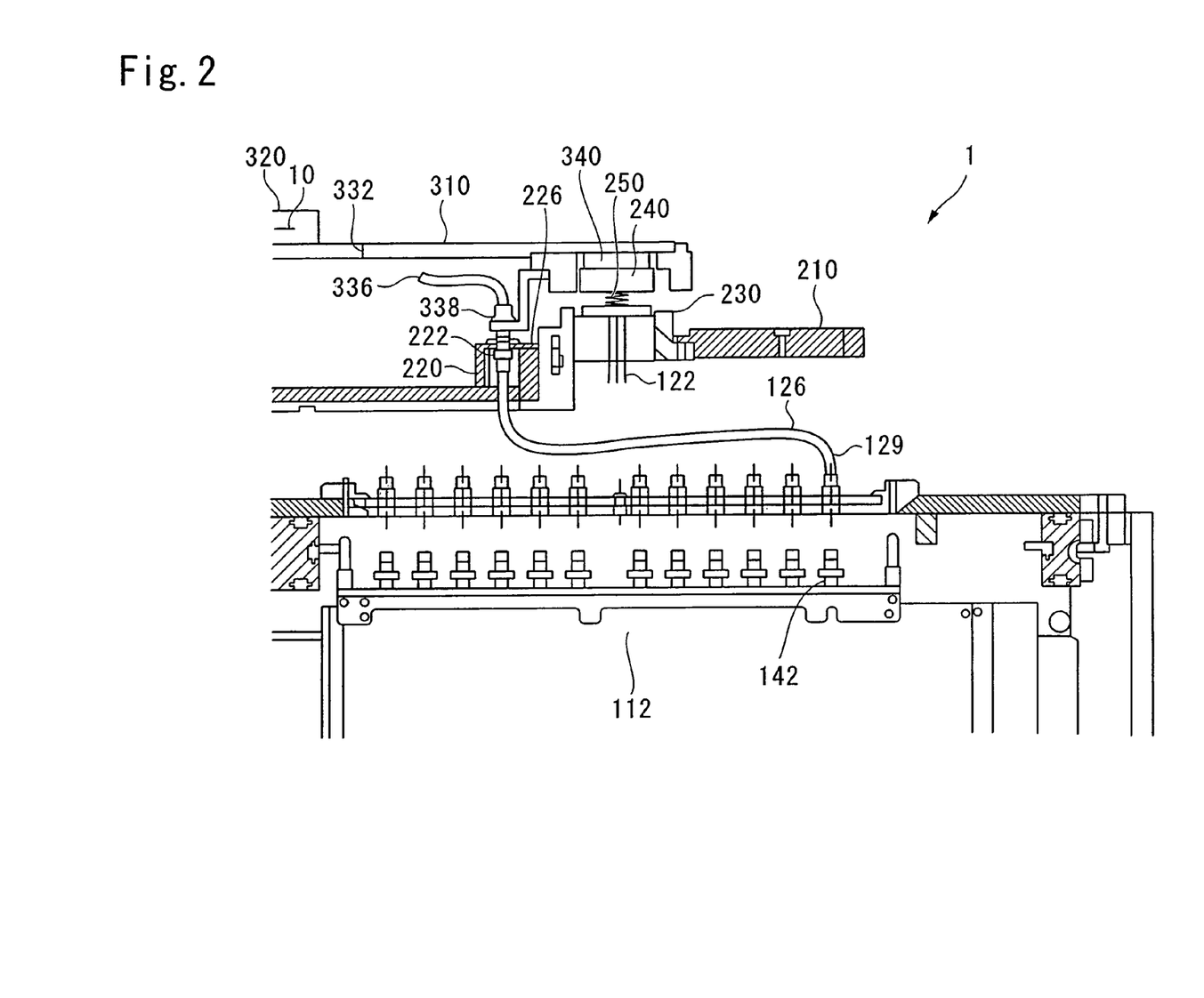
FIG. 2 is an enlarged view of a region surrounded by a two-dot chain line in FIG. 1.
Figure 3:
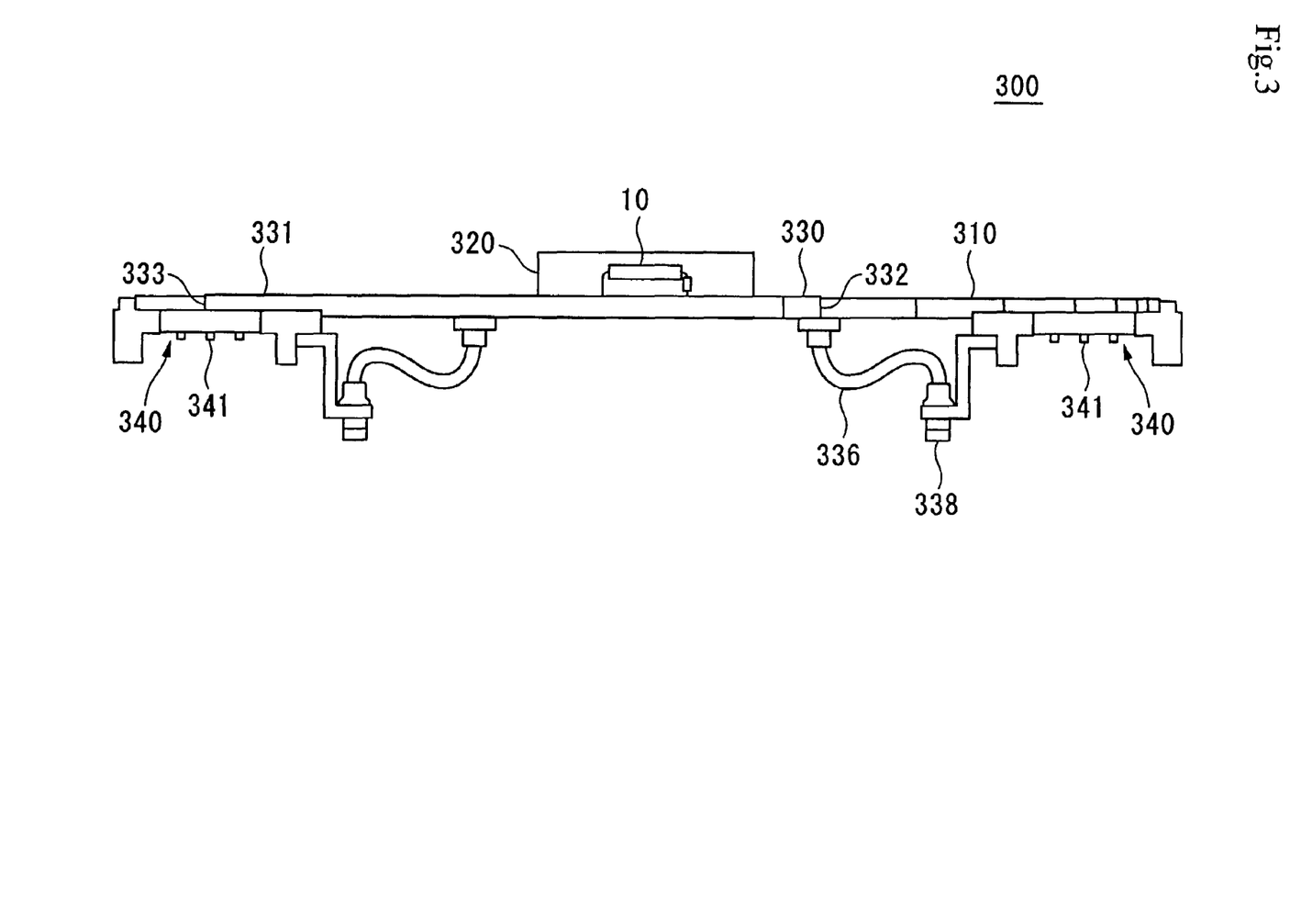
FIG. 3 is a side view of a performance board in the same embodiment.

As shown in FIG. 1, the test head body 100 incorporates a signal module 110 (signal modules 112 and 114) for processing a test signal. The signal modules 112 and 114 are respectively provided with connectors 142 and 146 according to a kind of the signal module. The connectors 142 and 146 respectively fit with connectors 129 and 144 provided on an upper surface of the test head body 100 and electrically connected to each other. The connector 129 is electrically connected to a cable 126, and the connector 144 is electrically connected to a coaxial cable 122. Note that, in FIG. 1 and FIG. 2, the connector 142 and the connector 129, and the connector 146 and the connector 144 are illustrated in a separated state for explanation, but these pairs of connectors are fitted to each other when actually used, As shown in FIG. 2 and FIG. 3, the performance board 300 comprises a board body 310, a socket 320 arranged at the approximate center of the board body 310 for an IC device 10 to be detachably attached, signal lines 330 and 331 extending from the socket 320, via 332 and 333 penetrating the board body 310 and connected respectively to the signal lines 330 and 331, a connector 338 electrically connected to the via 332 through a cable 336, and a connector 340 electrically connected to the via 333. Note that, in FIG. 3, the signal lines 330 and 331 are illustrated by one for each, but a large number of signal lines 330 and 331 are actually provided in accordance with the number of external terminals of the IC device 10 and the number of sockets 320.

Figure 7:
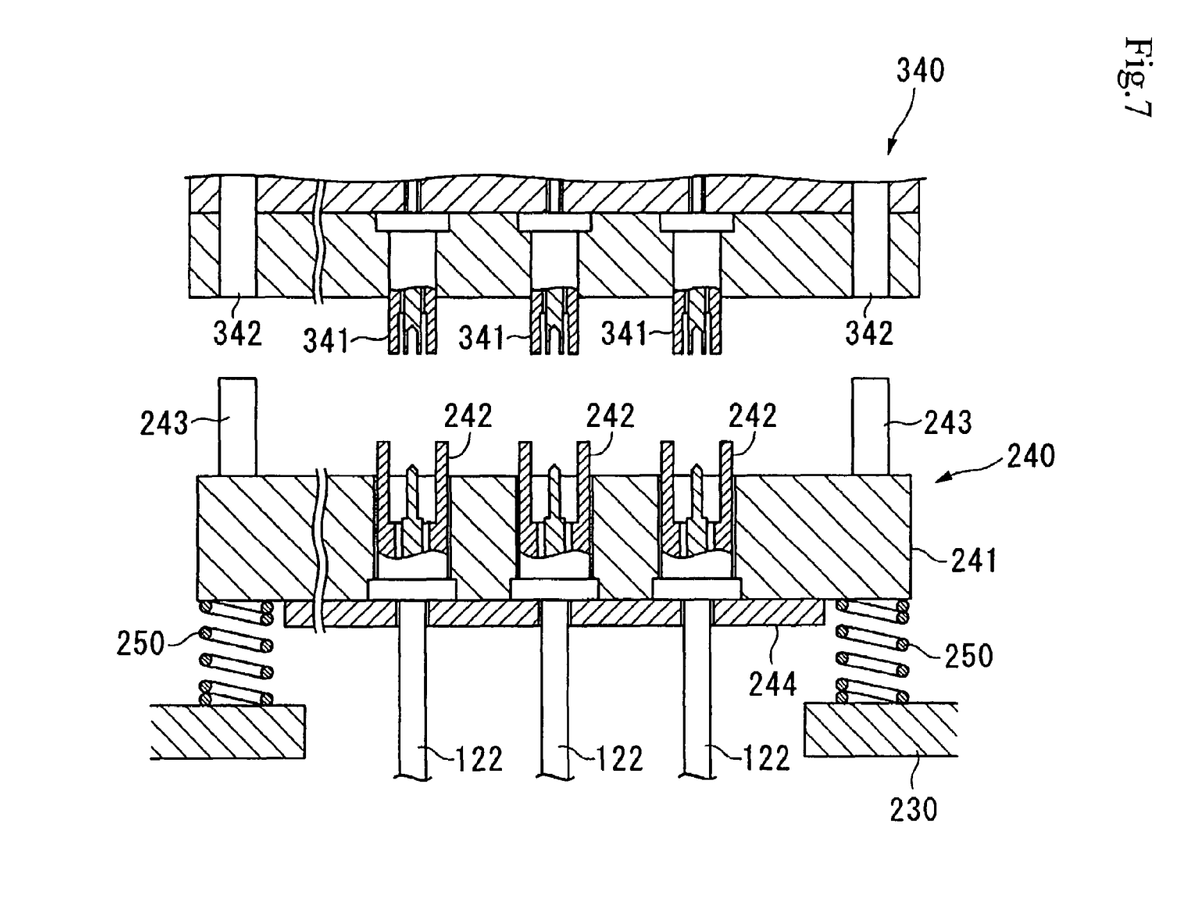
FIG. 7 is a sectional view of the connector housing in the same embodiment.

As shown in FIG. 3 and FIG. 7, the connector 340 is provided with connector pins 341 to be fit with later explained connector pins 242 of a connector housing 240 and guide holes 342 to be fit with guide pins 243 of the connector housing 240.

Figure 4:
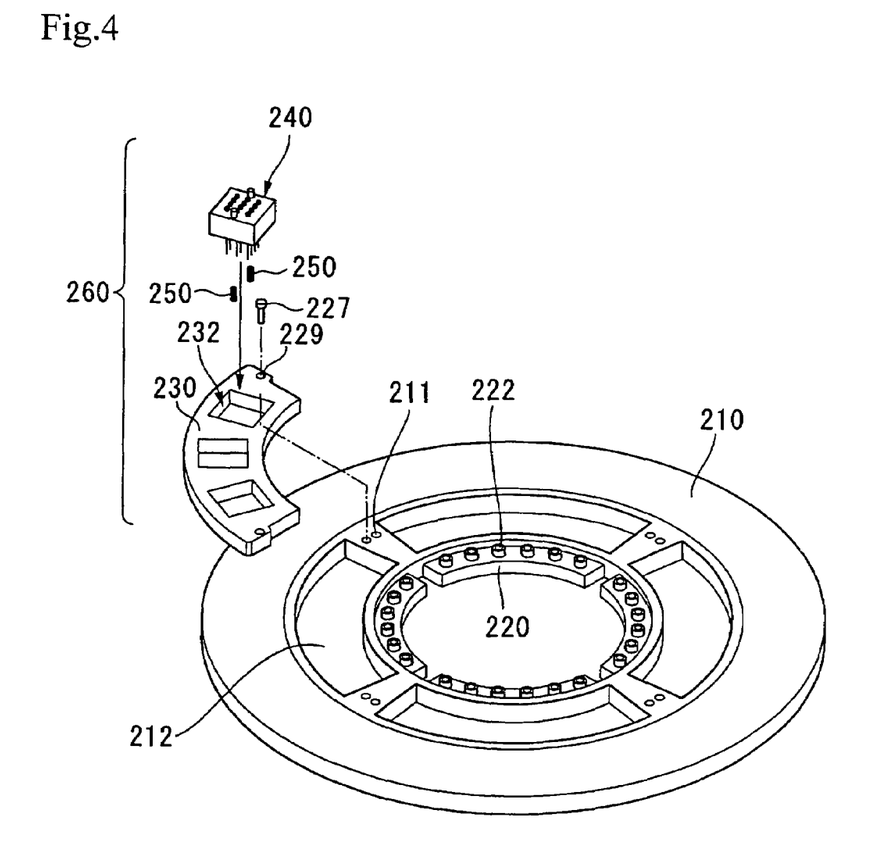
FIG. 4 is a disassembled perspective view of an interface member in the same embodiment.
Figure 5:
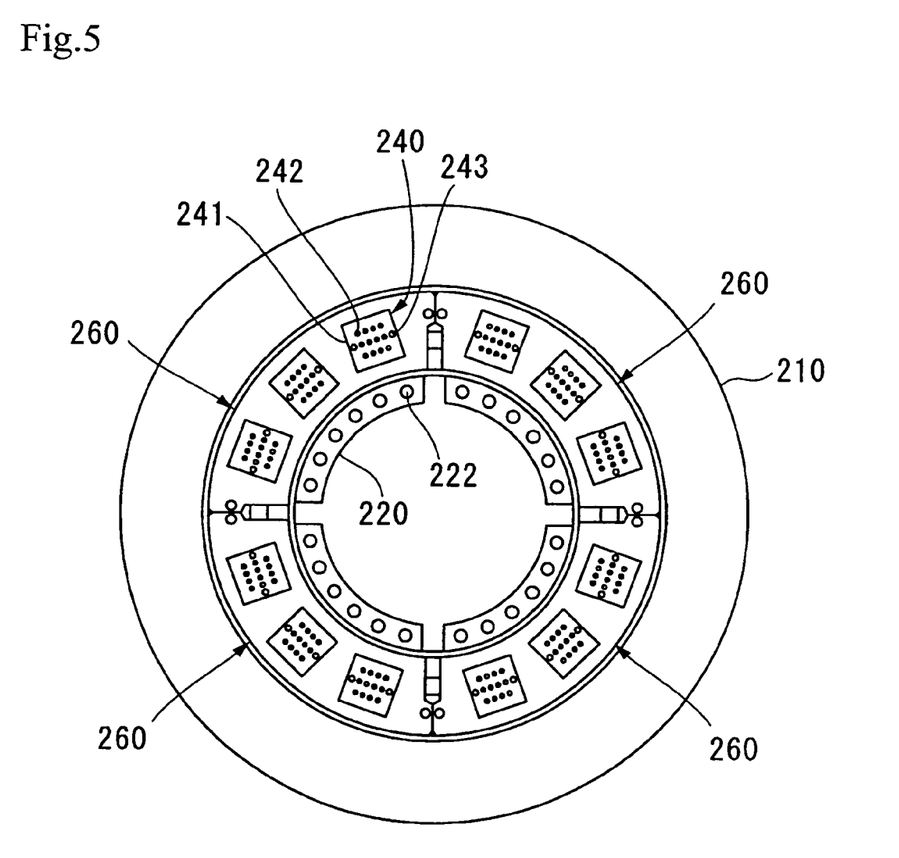
FIG. 5 is a plan view of the interface member in the same embodiment.

As shown in FIG. 4 and FIG. 5, the interface member 200 is provided with a body plate 210 having an approximate dish shape as a whole and having a recess at the center part. At the recess of the body plate 210, four inner connectors 220 each having an arc shape when viewed from above are provided circularly to be fit with connectors 338 of the performance board 300. Each of the inner connectors 220 is provided with connector pins 222, for example, arranged in line, and each of the connector pins 222 is electrically connected to a cable 126 connected to the signal module 112 of the test head body 100 as shown in FIG. 2.

As shown in FIG. 4 and FIG. 5, on the outer side of the inner connectors 220 on the body plate 210, four connector housing blocks 260 provided with connector housings 240 to be fit with the connectors 340 of the performance board 300 are provided circularly. At an attachment position of each connector housing block 260 on the body plate 210, a hole 212 is formed for the coaxial cable 122 connected to the connector pin 242 of the connector housing 240 to run through.

Each of the connector hosing blocks 260 is configured to comprise a block base 230, a plurality of (three in the present embodiment) connector housings 240 and two coil springs 250 provided between the connector housings 240 and the block base 230.

The block base 230 has an arc plate shape, and three connector housings 240 can be attached thereto along the arc. At an attachment position of each of the connector housings 240, a hole 232 is formed for the coaxial cable 122 connected to the connector pin 242 of the connector housing 240 to run through. Also, at both end portions of the block base 230, through holes 229 are formed and as a result that the screws 227 go through the through holes 229 to be screwed with screw holes 212 on the body plate 210, the block base 230 (connector housing block 260) is fixed to the body plate 210.

Figure 6:
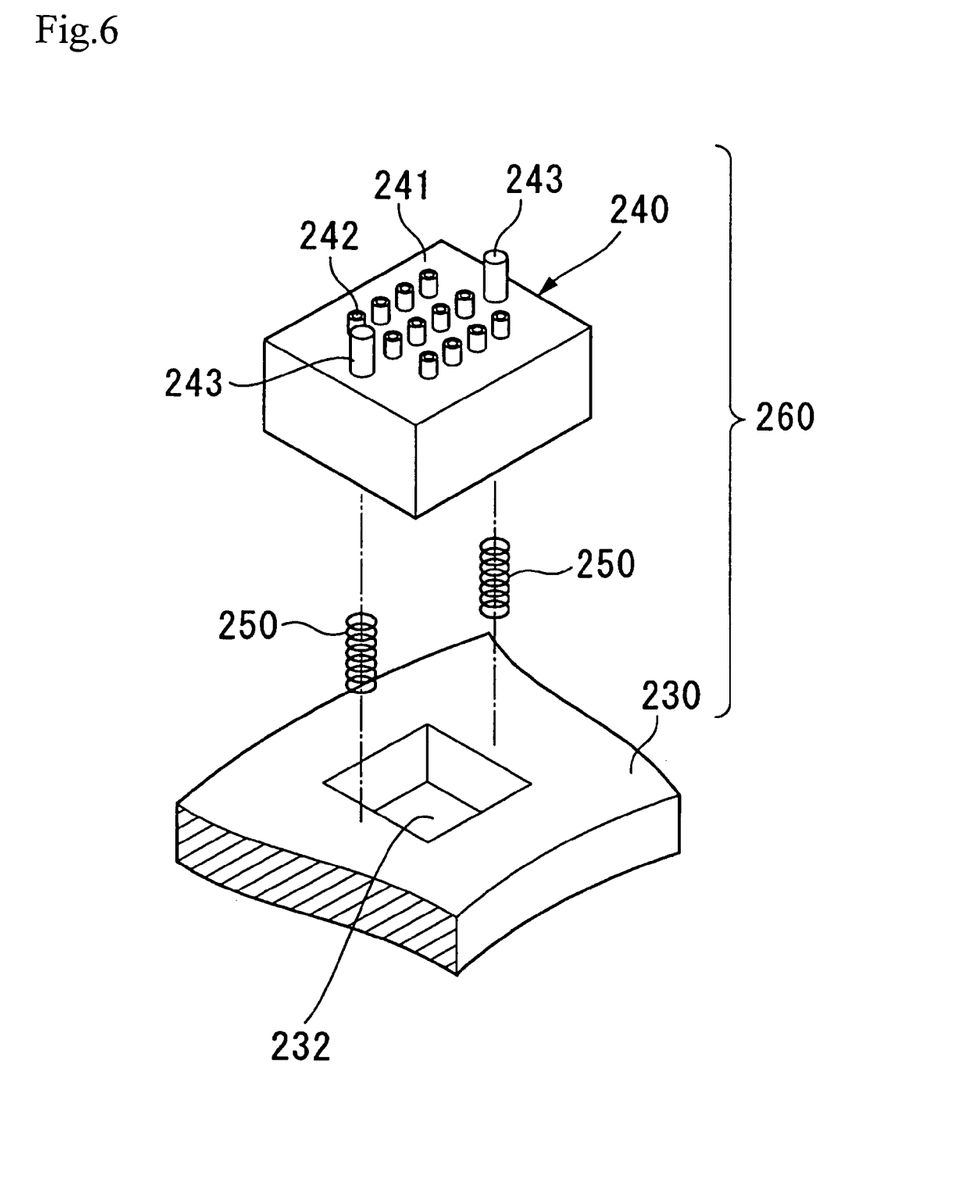
FIG. 6 is a perspective view of a connector housing in the same embodiment.

As shown in FIG. 4 and FIG. 6, the connector housing 240 in the present embodiment has an approximately quadrangular prism shape. The housing body 241 of the connector housing 240 is, as shown in FIG. 6 and FIG. 7, provided with a plurality of (12 in the present embodiment) connector pins 242. Connector pins 242 of the present embodiment are coaxial type connector pins for a high-frequency wave and are for being fit with the connector pins 341 provided to the connector 340 of the performance board 300 for being electrically connected to each other.

After inserted to the holes formed on the housing body 241, the connector pins 242 are fixed to the housing body 241 in a non-floating state as a result that the support plate 244 is attached to the housing body 241. Each of the connector pins 242 is, as shown in FIG. 1 and FIG. 7, electrically connected to the coaxial cable 122 connected to the signal module 114 of the test head body 100.

On both end portions on an upper surface of the housing body 241, guide pins 243 for fitting with the guide holes 342 formed on the connector 340 of the performance board 300 are provided.

The connector housing 240 is attached to the block base 230 via two coil springs 250. Namely, the coil springs 250 are provided on both end portions of a lower side of each connector housing 240, upper ends of the coil springs 250 are fixed to the bottom surface of the connector housing 240, and lower ends of the coil springs 250 are fixed to the block base 230.

As explained above, as a result that the coil springs 250 are provided between the connector housing 240 and the block base 230, the connector housing 240 becomes to be in a floating state with respect to the block base 230. Due to the floating structure, in the case of attaching the performance board 300 to the interface member 200, even if a positional error arises between the connectors 340 of the performance board 300 and the connector housings 240 of the interface member 200, as the guide pins 243 are inserted into the guide holes 342, the connector housings 240 in a floating state move in the X-axis, Y-axis and Z-axis directions, the positional error is absorbed, and the connectors 340 of the performance board 300 fit with the connector housings 240 of the interface member 200 in an aligned state. Namely, since the connectors 340 of the performance board 300 are provided with the guide holes 342 and the connector housings 240 of the interface member 200 are provided with the guide pins 243, by guiding the guide pins 243 of the connector housings 240 by the guide holes 342 of the connectors 340, the connector housings 240 can be fit with the connectors 340 more precisely. As a result, the connector pins 341 of the connectors 340 of the performance board 300 are surely connected to the connector pins 242 of the connector housings 240 of the interface member 200.

Accordingly, each of the connector pins 242 of the connector housings 240 does not have to be in a separately floating state by using a spring, etc. as in the conventional case. As a result, the number of parts of the connector housing 240 is decreased, and the connector housing 240 can be produced at a low cost. Furthermore, as a result that the conventionally used springs and a space for providing them become unnecessary for the respective connector pins 242, a plurality of connector pins 242 can be arranged closely and mounted at high density. Consequently, the connector housings 240 and, moreover, the interface member 200 can be downsized.

Here, the number of the connector pins 242 on one connector housing 240 is, for example, preferably 8 to 24 when considering the mounting density and production unevenness, etc.

By attaching the performance board 300 to the interface member 200 provided with the connector housing block 260 as above, fitting the connectors 340 and the connectors 338 of the performance board 300 respectively with the connector housings 240 and the inner connectors 220 of the interface member 200 to electrically connect the sockets 320 of the performance board 300 to the signal module 110 of the test head body 100, and mounting IC devices 10 to the sockets 320, the IC devices 10 can be tested.

Note that, as explained above, the connector housing blocks 260 and the inner connectors 220 are arranged circularly on the interface member 200. Due to the configuration, lengths of signal paths from respective connector pins 242 and 222 of the connector housing blocks 260 and inner connectors 220 to the sockets 320 (IC devices 10) can become approximately the same, so that preferable signal paths hard to give adverse effects on the test can be formed.

The embodiments explained above are described to facilitate understanding of the present invention and is not to limit the present invention. Accordingly, respective elements disclosed in the above embodiments include all design modifications and equivalents belonging to the technical scope of the present invention.

For example, to bring the connector housings 240 to be in a floating state, an elastic body formed by rubber, thermoplastic elastomer or other material or a device using pneumatic pressure or hydraulic pressure may be used instead of the coil spring 250. Also, the number of coil springs 250 is not particularly limited and may be provided, for example, to each corner of the connector housing 240 by four in total. Also, in the above embodiment, an arc-shaped block base 230 was used but, for example, a rectangular-shaped one may be also used.

INDUSTRIAL APPLICABILITY

The present invention is useful for reducing costs and downsizing of a connector housing block, moreover, an interface member and a test head.

The invention claimed is:

1. A connector housing block in an interface for electrically connecting a test head body and sockets in an electronic device testing apparatus comprising:
a connector housing and a block base;
wherein said connector housing comprises a housing body having a plurality of through holes and a plurality of connector pins inserted in the through holes, respectively, the connector pins being fixed to the housing body in a non-elastic manner, and being directly connected to terminals of another connector,
said connector housing is attached to said block base in a floating state, and
the connector pins are coaxial type connector pins connected to the terminals of the another connector by fitting at least a portion of the terminals of the another connector into respective ones of the connector pins.

2. The connector housing block as set forth in claim 1, wherein an elastic body is provided between said connector housing and said block base.

3. The connector housing block as set forth in claim 2, wherein said elastic body is a coil spring.

4. The connector housing block as set forth in claim 1, wherein said connector housing is provided with a guide portion capable of aligning the connector housing with a member to be connected to the connector housing.

5. The connector housing block as set forth in claim 4, wherein said guide portion is a guide pin or a guide hole capable of fining with a guide hole or a guide pin formed on a member to be connected to said connector housing.

6. The connector housing block as set forth in claim 4, wherein a member to be connected to said connector housing is a performance board.

7. The connector housing block as set forth in claim 1, wherein said connector pins each have a coaxial structure for carrying high-frequency waves.

8. The connector housing block as set forth in claim 1, wherein said block base has an approximately arc shape when viewed from above.

9. An interface member comprising the connector housing block as set forth in claim 1.

10. The interface member as set forth in claim 9, wherein said connector housing block is formed in a circular shape.

11. An electronic device testing apparatus comprising the interface member as set forth in claim 9.

12. A connector-fitting device comprising:
a first substrate having sockets for an electronic device to be tested to be attached; and
a second substrate connected to a test head body to be electrically connected to said first substrate, wherein:
said first substrate is provided with a first connector having a plurality of connector pins;
said first connector is provided with a first guide hole or a first guide pin for regulating fitting;
said second substrate is provided with a second connector having a plurality of connector pins at a position corresponding to the first connector of said first substrate;
said second connector comprises a housing body having a plurality of through holes and a plurality of connector pins inserted in the through holes, the conductor pins being in a non-floating state;
said second connector is provided with a second guide pin or a second guide hole for fitting with a first guide hole or a first guide pin of said first connector to align the first and second connectors, and is arranged such that it can move with respect to said second substrate; and
said connector pins of the first connector and said connector pins of the second connector are fitted each other by inserting the connector pins of one connector into the connector pins of the other connector.

13. The connector-fitting device as set forth in claim 12, wherein:
said first substrate is a performance board; and
said second substrate is an interface member.

14. An electronic device testing apparatus comprising the connector-fitting device as set forth in claim 12.

* * * * *